United States Patent
Trimberger et al.

(10) Patent No.: US 10,147,666 B1
(45) Date of Patent: Dec. 4, 2018

(54) LATERAL COOLING FOR MULTI-CHIP PACKAGES

(71) Applicant: Xilinx, Inc., San Jose, CA (US)

(72) Inventors: Stephen M. Trimberger, Incline Village, NV (US); Austin H. Lesea, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 47 days.

(21) Appl. No.: 14/449,052

(22) Filed: Jul. 31, 2014

(51) Int. Cl.
| | |
|---|---|
| *H05K 7/20* | (2006.01) |
| *G06F 1/20* | (2006.01) |
| *H01L 23/467* | (2006.01) |
| *H01L 33/64* | (2010.01) |
| *H01L 31/024* | (2014.01) |
| *H01S 5/024* | (2006.01) |
| *H01L 23/473* | (2006.01) |
| *H01L 23/544* | (2006.01) |
| *H01L 23/00* | (2006.01) |

(52) U.S. Cl.
CPC ............ *H01L 23/467* (2013.01); *G06F 1/206* (2013.01); *H01L 23/473* (2013.01); *H01L 23/544* (2013.01); *H01L 24/17* (2013.01); *H01L 31/024* (2013.01); *H01L 33/648* (2013.01); *H01S 5/02423* (2013.01); *H05K 7/20* (2013.01); *H01L 2223/54406* (2013.01); *H01L 2224/16137* (2013.01); *H01L 2224/16225* (2013.01); *H01L 2224/17519* (2013.01); *H01L 2924/11* (2013.01)

(58) Field of Classification Search
None
See application file for complete search history.

(56) References Cited

U.S. PATENT DOCUMENTS

| | | | | |
|---|---|---|---|---|
| 4,103,737 | A * | 8/1978 | Perkins | ................ H01L 23/467 165/109.1 |
| 4,765,397 | A * | 8/1988 | Chrysler | ............... H01L 23/473 165/104.33 |
| 5,168,348 | A * | 12/1992 | Chu | ...................... H01L 23/367 257/713 |
| 6,583,645 | B1 | 6/2003 | Bennett et al. | |
| 6,753,239 | B1 | 6/2004 | Conn | |
| 6,935,419 | B2 * | 8/2005 | Malone | ..................... F28F 3/02 165/146 |
| 6,945,712 | B1 | 9/2005 | Conn | |
| 8,081,465 | B2 * | 12/2011 | Nishiura | ............. H01L 23/3735 165/147 |
| 8,154,869 | B2 * | 4/2012 | Riebel | ...................... G06F 1/20 165/185 |

(Continued)

FOREIGN PATENT DOCUMENTS

EP        0875776 A2    11/1998

OTHER PUBLICATIONS

U.S. Appl. No. 14/297,527, filed Jun. 5, 2014, Lesea, Austin H. et al.

(Continued)

*Primary Examiner* — Courtney Smith
(74) *Attorney, Agent, or Firm* — Keith Taboada; Robert M. Brush (57) ABSTRACT

A method and apparatus are provided that includes an electronic device, a chip package and a method for cooling a chip package in an electronic device. In one example, the chip package includes an interposer or package substrate having a first IC die and a second IC die mounted thereon. The second IC die has a maximum safe operating temperature that is greater than a maximum safe operating temperature of the first IC die. An indicia is disposed on the chip package. The indicia designates an installation orientation of the interposer or package substrate which positions the first IC die upstream of the second IC die relative to a direction of cooling fluid flow.

20 Claims, 5 Drawing Sheets

(56) References Cited

U.S. PATENT DOCUMENTS

| | | | | |
|---|---|---|---|---|
| 8,363,402 B2* | 1/2013 | Brunschwiler | ....... | H01L 23/473 165/80.4 |
| 8,472,181 B2* | 6/2013 | Doll | .......... | G06F 1/20 361/679.49 |
| 8,913,389 B2* | 12/2014 | Fukui | ............ | H01L 23/367 174/548 |
| 2003/0218850 A1* | 11/2003 | Kubo | ............ | G06F 1/20 361/103 |
| 2006/0087822 A1* | 4/2006 | Cheng | ............ | G06F 1/18 361/784 |
| 2010/0277868 A1* | 11/2010 | Beaupre | ............ | H01L 23/473 361/700 |
| 2011/0012255 A1* | 1/2011 | Suganuma | .......... | H01L 23/3675 257/712 |
| 2013/0295723 A1* | 11/2013 | Khan | ............ | H01L 25/105 438/123 |
| 2014/0312483 A1* | 10/2014 | Vo | ............ | H01L 25/0652 257/691 |
| 2016/0019937 A1* | 1/2016 | Arora | ............ | G11C 7/04 365/163 |

OTHER PUBLICATIONS

U.S. Appl. No. 14/297,535, filed Jun. 5, 2014, Trimberger, Stephen M. et al.

Fedeli, Jean-Marc, "Lecture: Integration of silicon photonics with electronics", CEA-LETI, Helios, Silicon Photonics—PhD course prepared with FP7-224312 Helios project, Chapter 10, pp. 1-51, May 15, 2010.

Li, M.P., et al., "Transferring High-Speed Data over Long Distances with Combined FPGA and Multichannel Optical Modules", White Paper, WP 01177 1.0, Avago Technologies, Altera Corporation, pp. 1-7, AV02-3383EN, Mar. 21, 2012.

Tanaka, S. et al., "Silicon Photonics Optical Transmitter Technology for Tb/s-class I/O Co-packaged with CPU", Jan. 2014, pp. 123-131, vol. 50, No. 1, Fujitsu Sci Tech J.

Zhang, Yue et al., "Within-Tier Cooling and Thermal Isolation Technologies for Heterogeneous 3D ICs", 3D Systems Integration Conference (3DIC), 2013 IEEE International, Oct. 2-4, 2013, pp. 1-6, IEEE, San Francisco, CA.

* cited by examiner

LATERAL COOLING FOR MULTI-CHIP PACKAGES

BACKGROUND

Field of the Disclosure

Examples of the present disclosure generally relate to an electronic device comprising chip packaging, and in particular, to an electronic device comprising chip packaging having a through-silicon-via (TSV) interposer with integrated circuit (IC) dies, the IC dies having different temperature sensitivities.

Description of the Related Art

Electronic devices, such as tablets, computers, copiers, digital cameras, smart phones, control systems and automated teller machines, among others, often employ electronic components which leverage chip packaging for increase functionality and higher component density. Conventional chip packaging schemes often utilize a through-silicon-via (TSV) interposer to enable a plurality of integrated circuit (IC) dies to be mounted to a single organic substrate. The dies may include memory, logic or other IC device. The interposer generally includes an interconnect wiring layer disposed on a core. The interconnect wiring layer is coupled by micro-bump solder connections to the various dies disposed on the interposer.

In many instances, one die disposed on the interposer has a greater temperature sensitivity relative to the other dies disposed on the interposer. The customary practice for dealing with such differences in temperature sensitivity between dies is to utilize larger heat sinks and larger heat spreaders disposed on the dies as needed. This approach is undesirable since the larger heat sinks and larger heat spreaders add undesirable expense and manufacturing complexity, and may cause the package to exceed design size criteria.

Therefore, a need exists for an improved chip packaging, and in particular, to a through-silicon-via (TSV) interposer with integrated circuit (IC) dies having different temperature sensitivities methods for fabricating a chip package utilizing the same.

SUMMARY

A method and apparatus are provided which preferentially cools one die of a IC package relative to another die of the chip package. Advantageously, the preferential cooling prevents an IC die of the chip package having greater sensitivity to temperature relative the neighboring IC die from being heated by the neighboring IC die.

In one example, the chip package is provided that includes an interposer or package substrate having a first IC die and a second IC die mounted thereon. The second IC die has a maximum safe operating temperature that is greater than a maximum safe operating temperature of the first IC die. An indicia is disposed on the chip package. The indicia designates an installation orientation of the interposer or package substrate which positions the first IC die upstream of the second IC die relative to a direction of cooling fluid flow.

In another example, an electronic device is provided that includes a chip package mounted in a housing. The chip package includes a first IC die comprising an optical device and a second IC die. The IC dies are mounted to an interposer. The second IC die has a maximum safe operating temperature greater than a maximum safe operating temperature of the first IC die. The interposer is disposed in the housing in an orientation that positions the first IC die upstream of the second IC die relative to a direction of a cooling fluid flow induced within the housing.

In another example, an electronic device is provided that includes a chip package mounted in a housing. The chip package includes a first IC die comprising an optical device and a second IC die. The IC dies are mounted to an interposer. The second IC die has a maximum safe operating temperature greater than a maximum safe operating temperature of the first IC die. A fan is also disposed in the housing. The fan operable to induce a cooling fluid flow within the housing. The interposer is disposed in the housing in an orientation that positions the first IC die upstream of the second IC die relative to a direction of the cooling fluid flow.

In yet another example, a method for cooling an electronic device is provided that includes inducing a flow of cooling fluid within a housing of an electronic device, the flow having a direction defined by the cooling fluid flowing across a first IC die and a second IC die, the IC dies coupled to an interposer, the first IC die having a maximum safe operating temperature less than a maximum safe operating temperature of the second IC die.

BRIEF DESCRIPTION OF THE DRAWINGS

So that the manner in which the above recited features of the present disclosure can be understood in detail, a more particular description of the implementation, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Examples of the disclosure generally provide an electronic device comprising a chip package having a through-silicon-via (TSV) interposer with integrated circuit (IC) dies, the IC dies having different temperature sensitivities. In particular, the IC dies are arranged within the electronic device such that an IC die having greater sensitivity to temperature is oriented upstream of an IC die having lesser sensitivity to temperature relative to the direction of cooling fluid flow passing across the IC dies. Advantageously, the orientation of the IC dies relative to the direction of the fluid flow within the electronic device prevents the IC having greater sensitivity to temperature from being adversely effected from heat generated by the die having lesser sensitivity to temperature. Thus, the orientation of the IC dies relative to the direction of the fluid flow within the electronic device allows better device performance over a wider range of operating conditions, with less expense and manufacturing complexity.

Figure 1:
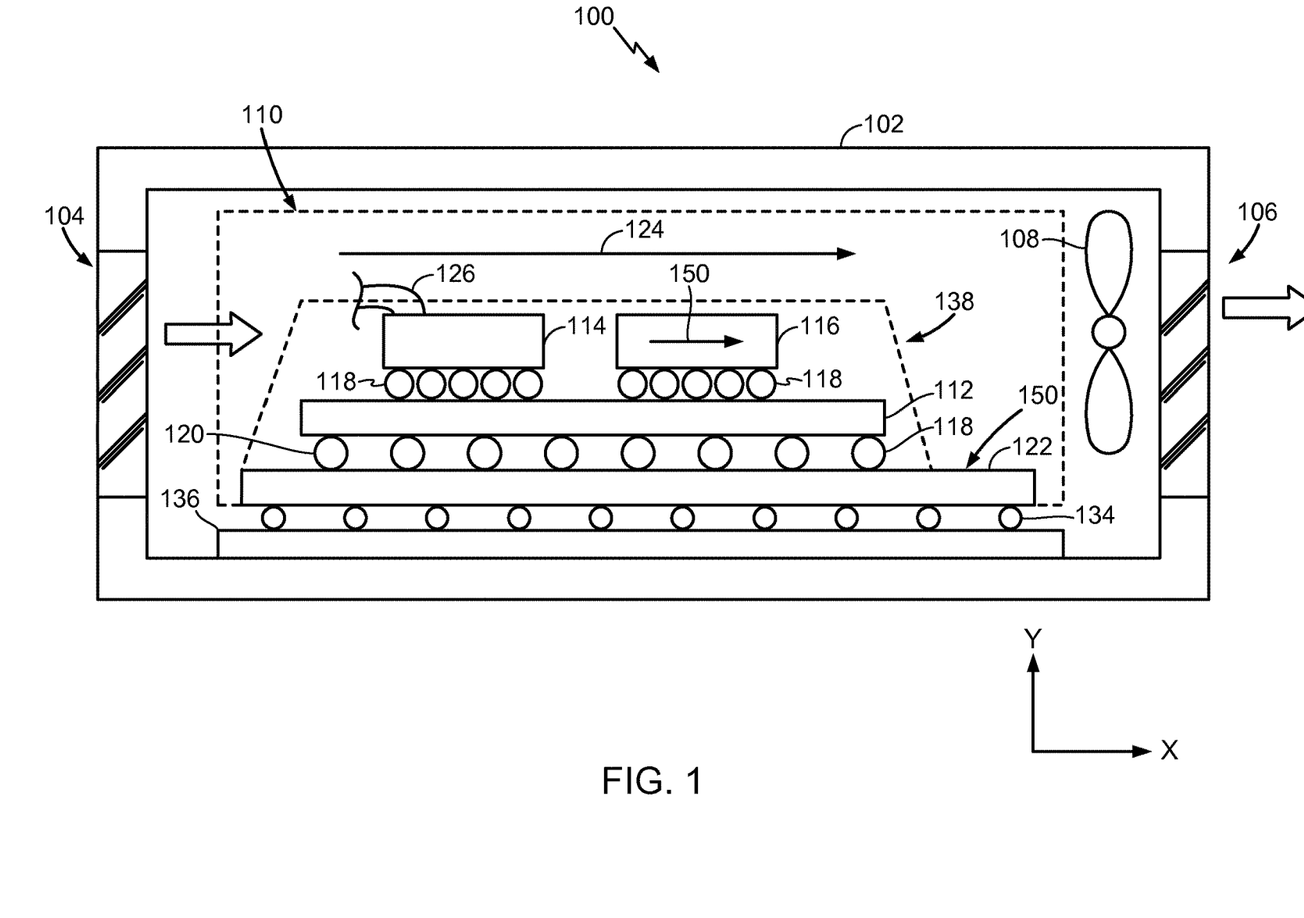
FIG. 1 is a front schematic view of an electronic device having an integrated chip package including a plurality of IC dies.

Turning now to FIG. 1, an exemplary electronic device 100 is schematically illustrated. The electronic device 100 includes an integrated chip package 110 disposed in a housing 102. The electronic device 100 may be a computer, tablet, cell phone, smart phone, consumer appliance, control system, automated teller machine, programmable logic controller, printer, copier, digital camera, television, monitor, stereo, radio, radar, or other device utilizing and having a chip package 110 disposed therein.

The chip package 110 includes a plurality of IC dies 114, 116 connected optionally by a silicon-through-via (TSV) interposer 112 to a package substrate 122. The chip package 110 may also have an overmold 138 covering the IC dies 114, 116 The interposer 112 includes circuitry for electrically connecting the dies 114, 116 to circuitry of the package substrate 122. The circuitry of the interposer 112 may optionally include transistors. Package bumps 132, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. The PCB 136 is mounted in the interior of the housing 102.

The IC dies 114, 116 are mounted to one or more surfaces of the interposer 112, or alternatively, to the package substrate 122. The IC dies 114, 116 may be programmable logic devices, such as field programmable gate arrays (FPGA), memory devices, optical devices, processors or other IC logic structures. Optical devices include photo-detectors, lasers, optical sources, and the like. In the example depicted in FIG. 1, the IC dies 114, 116 are mounted to a top surface of the interposer 112 by a plurality of micro-bumps 118. The micro-bumps 118 electrically connect the circuitry of each IC die 114, 116 to circuitry of the interposer 112. The circuitry of the interposer 112 connects the micro-bumps 118 to selective package bumps 132, and hence, connects selective circuitry of each IC die 114, 116 to the package substrate 122, to enable communication of the dies 114, 116 with the PCB after the package 110 is mounted within the within the electronic device 100. When the optional interposer 112 is not present, the micro-bumps 118 connects selective circuitry of each IC die 114, 116 to the package substrate 122 to enable communication of the dies 114, 116 with the PCB after the package 110 is mounted within the within the electronic device 100.

As discussed above, the first IC die 114 has a greater sensitivity to temperature than the second IC die 116. For example, the first IC die 114 may have a maximum safe operating temperature that is less than a maximum safe operating temperature of the second IC die 116. In one example, the first IC die 114 may be an optical device, such as a laser, optical source or optical detector, which has a maximum safe operating temperature less than that of the second IC die 116, which may be a field programmable gate arrays (FPGA), memory devices, optical devices, processors or other IC logic structure. In the example depicted in FIG. 1, the first IC die 114 is an optical device, having an optical connector 126, such as a fiber optical cable, extending therefrom, while the second IC die 116 is a programmable logic device, such as a field programmable gate array (FPGA), memory device, optical device, processor or other IC logic structure. The first IC die 114 may also be an RF device, such as a Bluetooth™, 802.3 Wi-Fi, wireless or other communication device, an A/D converter, and a D/A convertor, among others.

In order to reduce the amount of heat generated by the second IC die 116 from transferring and disadvantageously heating the first IC die 114, the chip package 110 is orientated within the housing 102 such that the first IC die 114 is located upstream of the second die 116 relative to the direction of cooling fluid (shown by arrow 124) passing across the IC dies 114, 116. The cooling fluid may be a gas or liquid, such as air, FREON, alcohol, nitrogen, among others. This arrangement allows for the elimination or scaling back of more costly cooling strategies while enabling a wider range of dies to be utilized in a single chip package.

Figure 2:
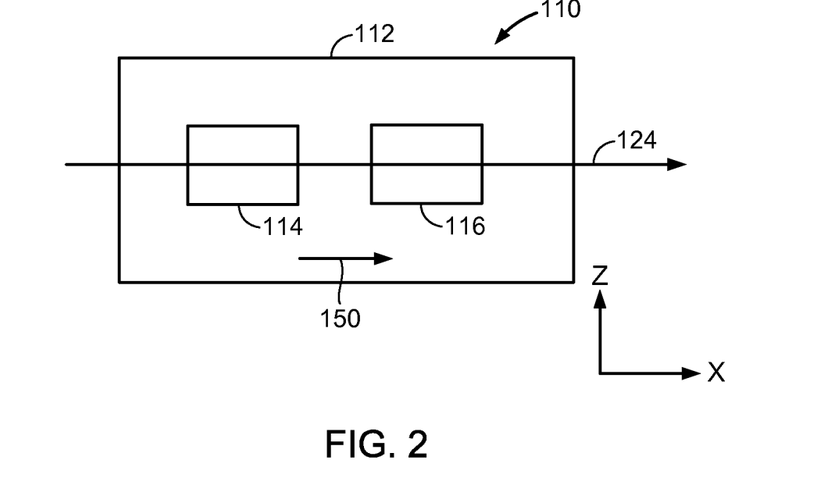
FIG. 2 is a top schematic view of the integrated chip package disposed in the electronic device of FIG. 1.

The cooling fluid flow 124 may be induced in a variety of manners, for example, convection, vacuum pumps, blowers and fans, among others. In the example depicted in FIG. 1, the cooling fluid flow 124 (i.e., air) is induced by a fan 108. The fan 108 is disposed in the housing 102 of the electronic device 100, and may be positioned proximate an outlet vent 106 such that the fan 108 pulls fluid, heated by the electronic and other devices with in the housing 102, out of the electronic device 100 through the outlet vent 106. The fan 108 additionally draws ambient fluid (i.e., air) from outside the electronic device 100 into the housing 102 through an inlet vent 104. The cooling fluid flow 124 thus travels from the inlet vent 104, sequentially across the dies 114, 116 of the package 110, and out the outlet vent 106. Although the path of the cooling fluid flow 124 within the electronic device 100 illustrated in FIG. 1 is depicted as traveling linearly through the housing 102 between the vents 104, 106, it is contemplated that the cooling fluid flow 124 may follow a torturous path through the housing 102 while still retaining a directionality across the package 110 such that one die (e.g., the first IC die 114) is orientated upstream of another die (e.g., the second IC die 116). In the example illustrated in FIG. 1, the interposer 112 (and thus the IC dies 114, 116) are arranged in an X/Z plane, as also illustrated in FIG. 2, such that the directionality of the cooling fluid flow 124 across the IC dies 114, 116 is also substantially in the X/Z plane, and predominately in the X direction from the first IC die 114 towards the second IC die 116.

Thus, directionality of the cooling fluid flow 124 sequentially across the IC dies 114, 116 prevents the downstream second IC die 116 from heating the first IC die 114. This allows a die having greater temperature sensitivity to be utilized alongside a die that generates a greater amount of heat in a single chip package without having to rely on costly cooling countermeasures.

Although not shown, it is contemplated that one or more additional IC dies may be stacked on one or both of the IC dies 114, 116. It is desirable that the additional stacked IC dies are arranged relative to the fluid flow 124 such that a stacked die having a greater temperature sensitivity is located upstream of a stacked die having a lesser temperature sensitivity. For example, a stacked die having a lesser temperature sensitivity relative to the first IC die 114 may be located downstream of the first IC die 114, such as stacked on the second IC die 116.

Figure 3:
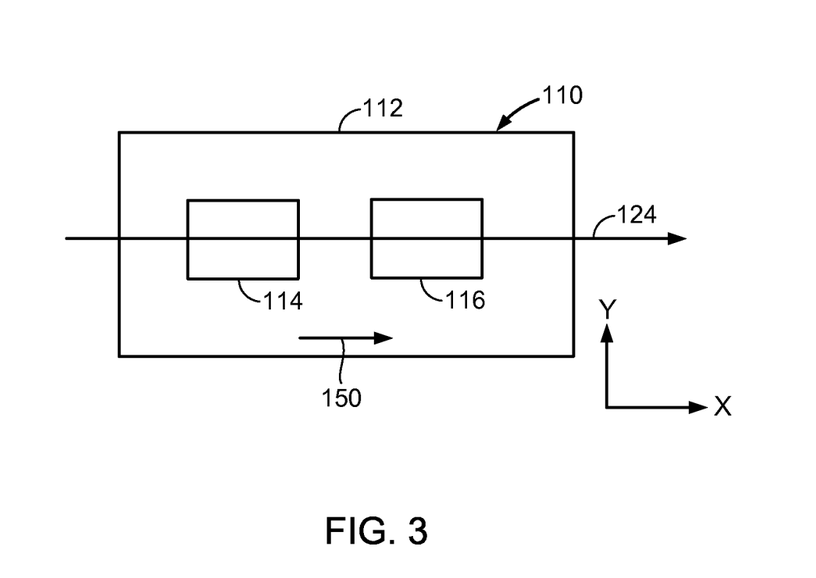
FIG. 3 is a front schematic view of an integrated chip package disposed in an alternative orientation within the electronic device of FIG. 1.

FIG. 3 is a front schematic view of an integrated chip package 110 disposed in an alternative orientation within the electronic device 100 of FIG. 1. The other details of electronic device 100 are not illustrated in FIG. 3. In the example illustrated in FIG. 3, the interposer 112 of the integrated chip package 110 (and thus the IC dies 114, 116) are arranged in an X/Y plane, such that the directionality of the cooling fluid flow 124 across the IC dies 114, 116 is also substantially in the X/Y plane, and predominately in the X direction from the first IC die 114 towards the second IC die 116. Thus, the first IC die 114 is positioned upstream of the second IC die 116 to substantially prevent heating of the first IC die 114 by the second IC die 116.

Figure 4:
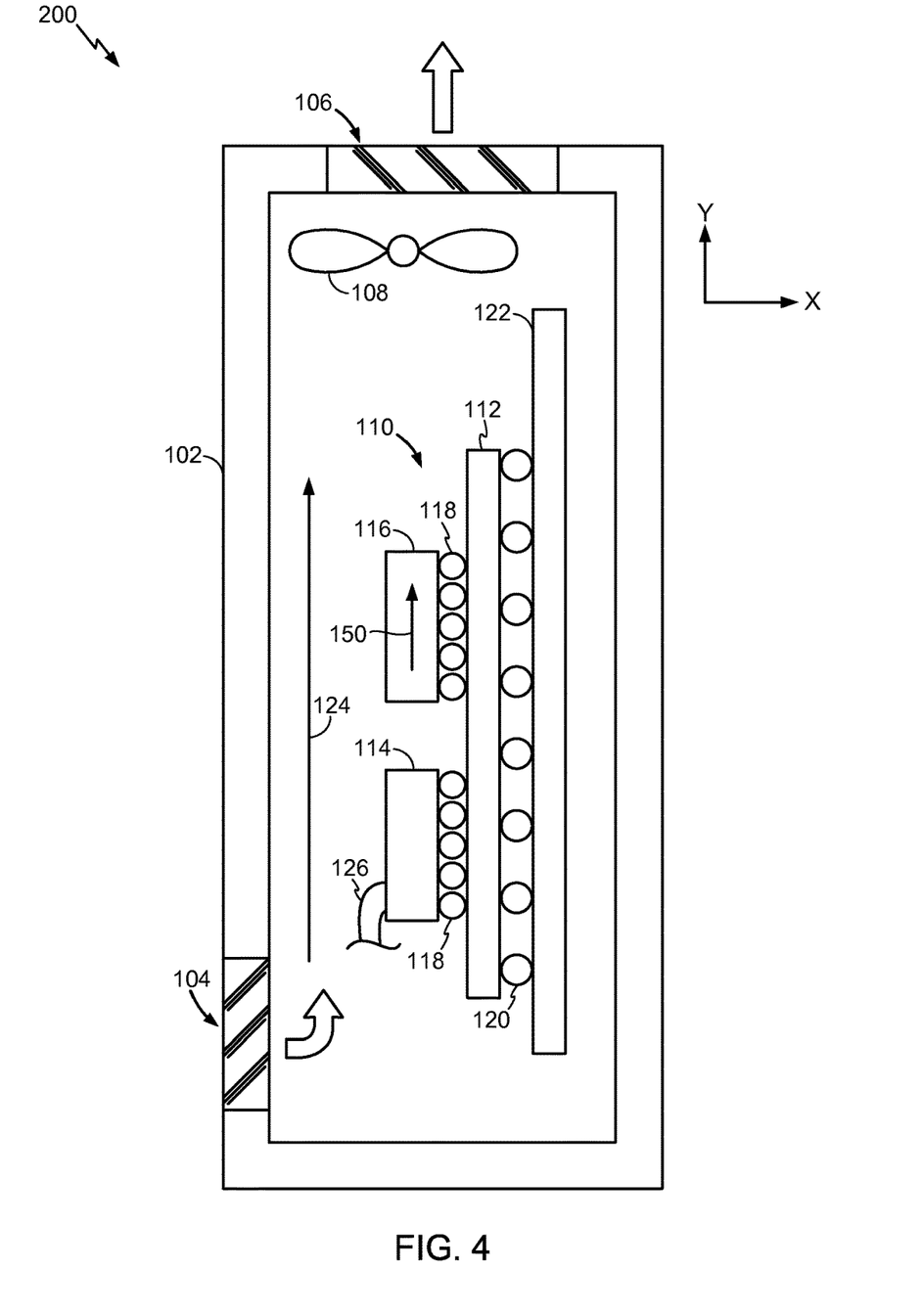
FIG. 4 is a front schematic view of an electronic device having an integrated chip package including a plurality of IC dies disposed in another orientation.

FIG. 4 is a front schematic view of an electronic device 100 having an integrated chip package 110 including a plurality of IC dies 114, 116 disposed in another orientation. In the example depicted in FIG. 4, the cooling fluid flow 124 across the IC dies 114, 116 inside the housing 102 may be induced by convection (i.e., heat rising within the housing 102), or as shown in FIG. 4, induced by positioning the cooling fan 108 in a position that draws the cooling fluid flow 124 in a substantially vertical direction (i.e., Y direction) across the IC dies 114, 116. For example, the fan 108 and outlet vent 106 may be positioned above the IC dies 114, 116 while the inlet vent 104 is positioned below the IC dies 114, 116.

For example, the interposer 112 of the integrated chip package 110 (and thus the IC dies 114, 116) may be arranged in an X/Y plane, such that the directionality of the cooling fluid flow 124 across the IC dies 114, 116 is also substantially in the X/Y plane, and predominately in the Y direction from the first IC die 114 towards the second IC die 116. Thus, the first IC die 114 is positioned below and upstream of the second IC die 116 to substantially prevent heating of the first IC die 114 by the second IC die 116.

Figure 5:
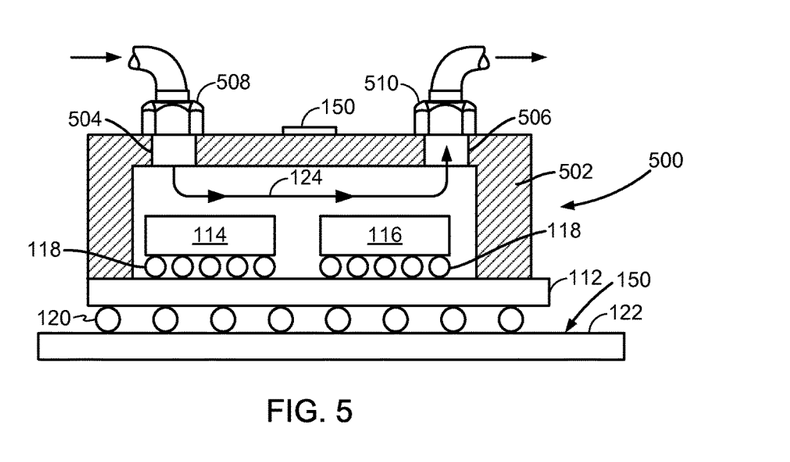
FIG. 5 is a schematic sectional view of another example of an integrated chip package including a plurality of IC dies connected by a TSV interposer to a package substrate.

FIG. 5 is a schematic sectional view of another example of an integrated chip package 500 including a plurality of IC dies 114, 116 connected by a TSV interposer 112 to a package substrate 122. The integrated chip package 500 may be disposed in the electronic device 100 (not shown in FIG. 3), for example, in addition to, or in place of, the chip package 110 (shown in FIG. 1). The integrated chip package 500 may be substantially identical to the integrated chip package 110, except wherein the chip package 500 includes a vented housing 502 through which cooling fluid flow 124 may be routed sequentially across the IC dies 114, 116. The cooling fluid flow 124 within the vented housing 502 may be induced by the fan 108 (shown in FIG. 8), or by another source, such as a fan, blower, vacuum source or other fluid moving device.

In the example depicted in FIG. 5, the housing 502 includes an inlet vent 504 and an outlet vent 506. The orientation of the inlet vent 504 and the outlet vent 506 is selected such that the cooling fluid flow 124 flows from the inlet vent 504, across the first IC die 114, then across the second IC die 116, prior to exiting the housing 502 through the outlet vent 506. A fitting 508 is coupled to the inlet vent 504 to allow the fluid entering the inlet vent 504 to be supplied from a predefined location or source. A fitting 510 is coupled to the outlet vent 506 to allow the fluid exiting the outlet vent 504 to be routed to a predefined location or source.

The orientation of vents 504, 506 of the housing 502 relative to the dies 114, 116 cause the cooling fluid flow 124 across the first IC die 114 prior to flowing across the second IC die 116 not matter how the chip package 500 is oriented within the electronic device 100. Thus, the first IC die 114 is allows positioned upstream of the second IC die 116 to substantially prevent heating of the first IC die 114 by the second IC die 116.

Figure 6:
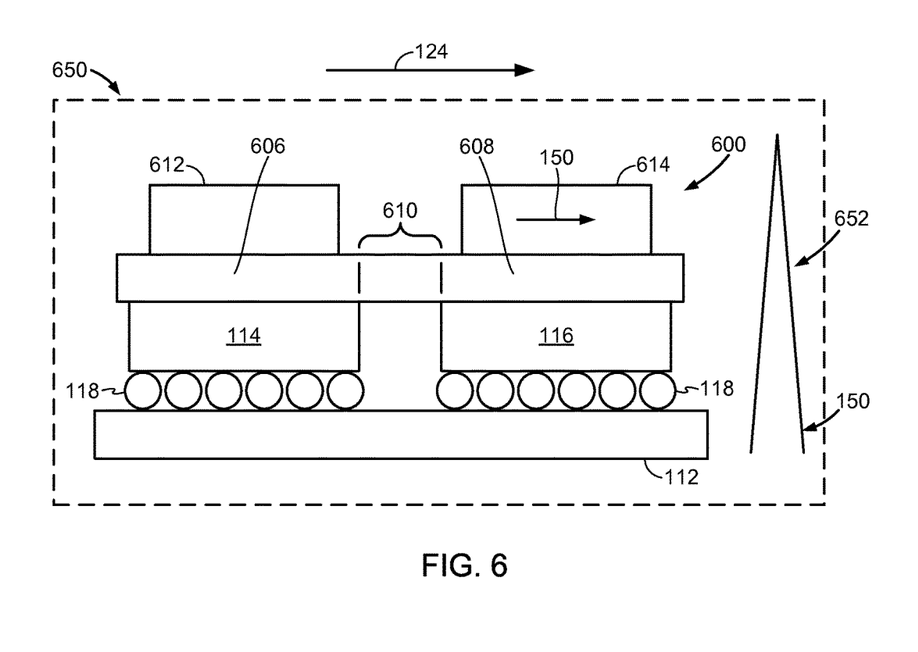
FIG. 6 is a schematic sectional view of an integrated chip package including a plurality of IC dies interfaced with at least one heat spreader and heat sinks.

FIG. 6 is a schematic sectional view of an integrated chip package 600 including a plurality of IC dies 114, 116 interfaced with at least one heat spreader 602 and one or more heat sinks. In the example in FIG. 6, two heat sinks 612, 614 are shown. The IC dies 114, 116 are coupled through an interposer 112 to a package substrate 122 as described above with reference to FIG. 1. The integrated chip package 600 may be disposed in the electronic device 100 (not shown in FIG. 1), for example, in addition to, or in place of, the chip package 110 (shown in FIG. 1). The integrated chip package 600 may optionally also include a vented housing 502 as illustrated in the example depicted in FIG. 5 to enclose the heat spreader 602 and heat sinks 612, 614. The heat spreader 602 and heat sinks 612, 614 may also be utilized on the chip packages 110, 500, or other suitable chip package.

The heat spreader 602 is utilized to draw heat from the IC dies 114, 116. The heat spreader 602 may be segmented into separate regions, for example, a first region 606 disposed in contact with a top of the first IC die 114, and a second region 608 disposed in contact with a top of the second IC die 116. The first and second regions 606, 608 of the heat spreader 602 are fabricated from a material having good thermally conductivity, for example, a metal such as aluminum. The heat spreader 602 may additionally include thermal choke 610 defined between the first region 606 and the second region 608 to inhibit heat transfer from the second IC die 116 to the first IC die 114 through the heat spreader 602. The thermal choke 610 may be advantageously oriented substantially perpendicular to the fluid flow 124 moving across the IC dies 114, 116 within the electronic device 100. In one example, the thermal choke 610 is fabricated from a material have a coefficient of thermal conductivity less than the coefficient of thermal conductivity of the first and second regions, 606, 608, such as a dielectric material.

Figure 7:
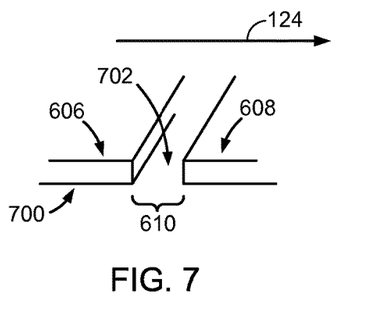
FIG. 7 is a partial perspective view of one example of a heat spreader disposed in one orientation relative to fluid flow within an electronic device.

FIG. 7 is a partial perspective view of another example of the heat spreader 602 disposed in one orientation relative to fluid flow 124 within an electronic device 100. The heat spreader 602 may be utilized on any of the chip packages 110, 500 described above. The first and second IC dies 114, 116 disposed in the first and second regions 606, 608 are not shown in FIG. 7. In the example in FIG. 7, the thermal choke 610 is in the form of an air gap 702, physically separating the regions 606, 608 of heat spreader 602 into separate plates.

Figure 8:
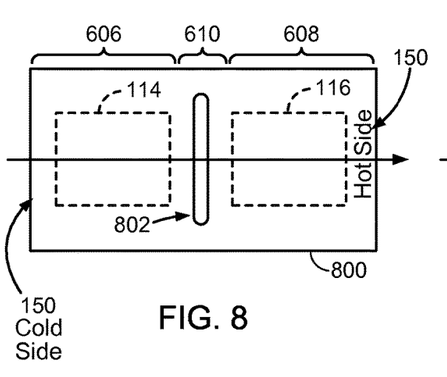
FIG. 8 is a top view of another example of a heat spreader disposed in one orientation relative to fluid flow within an electronic device.

FIG. 8 is a top view of another example of a heat spreader 800 disposed in one orientation relative to fluid flow 124 within an electronic device 100. The heat spreader 800 may be utilized on any of the chip packages 110, 500 described above. The first and second IC dies 114, 116 disposed in the first and second regions 606, 608 are shown in phantom. In the example in FIG. 8, the thermal choke 610 is in the form of one or more slots 802 formed in or though the heat spreader 800 separating the regions 606, 608, and thus the IC dies 114, 116 of IC package. The one or more slots 802 may be in the form of an air gap, or alternatively, be filled with a material having a coefficient of thermal conductivity less than the coefficient of thermal conductivity of the first and second regions, 606, 608, such as a dielectric material In the example depicted in FIG. 8, one slot 802 is formed between the regions 606, 608, and thus the IC dies 114, 116. As heat transfers faster through the material comprising the heat spreader 800 than across the region defined by the slot 802, the slot 802 substantially inhibits heating of the first IC die 114 by the second IC die 116.

Figure 9:
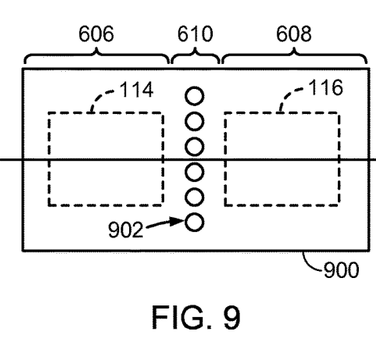
FIG. 9 is a top view of another example of a heat spreader disposed in one orientation relative to fluid flow within an electronic device.

FIG. 9 is a top view of another example of a heat spreader 900 disposed in one orientation relative to fluid flow 124 within an electronic device 100. The heat spreader 900 may be utilized on any of the chip packages 110, 500 described above. The first and second IC dies 114, 116 disposed in the first and second regions 606, 608 are shown in phantom. The heat spreader 900 is substantially similar to the heat spreader 800 described above, except wherein the one or more slots 802 are replaced by one or more holes 902 defining the thermal choke 610. The one or more holes 902 may be in the form of through or blind hole, and optionally filled with a material having a coefficient of thermal conductivity less than the coefficient of thermal conductivity of the first and second regions, 606, 608, such as a dielectric material In the example depicted in FIG. 9, a plurality of holes 902 are formed between the regions 606, 608, and thus the IC dies 114, 116. The plurality of holes 902 may be linearly arranged, for example, in a line perpendicular to the direction of the fluid flow 124 across the dies 114, 116. As heat transfers faster through the material comprising the heat spreader 900 than across the region of the spreader 900 having the plurality of holes 902, the holes 902 inhibits the flow of heat from the second region 608 to the first region 606, thereby reducing the amount of heat transferred from the second IC die 116 to the first IC die 114.

Figure 10:
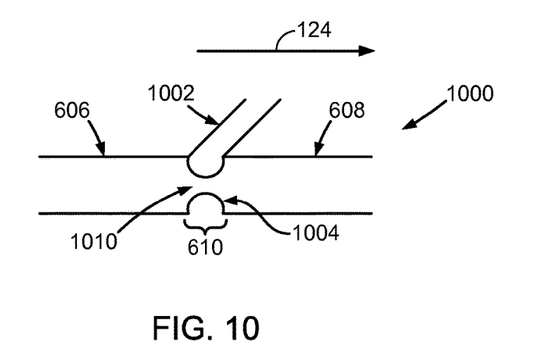
FIG. 10 is a partial perspective view of another example of a heat spreader disposed in one orientation relative to fluid flow within an electronic device.

FIG. 10 is a partial perspective view of another example of a heat spreader 1000 disposed in one orientation relative to fluid flow 124 within an electronic device 100. The heat spreader 1000 may be utilized on any of the chip packages 110, 500 described above. The first and second IC dies 114, 116 disposed in the first and second regions 606, 608 are not shown in FIG. 10. The heat spreader 900 is substantially similar to the heat spreaders 602, 800, 900 described above, except wherein the one or more slots 802 or holes 902 are replaced by one or more grooves, leaving a thin web of material 1010 connecting the regions 606, 608 and defining the thermal choke 610. The one or more grooves may be formed one or both of a top side of the heat spreader 1000 and a bottom side (i.e., the side facing the dies 114, 116) of the heat spreader 1000. In the example depicted in FIG. 10, a first groove 1002 is formed in top side of the heat spreader 1000, while a second groove 1004 is formed in the bottom side of the heat spreader 1000, thus leaving the web of material 1010 therebetween defining the thermal choke 610. The grooves 1002, 1004 may be unfiled, or optionally filled with a material having a coefficient of thermal conductivity less than the coefficient of thermal conductivity of the first and second regions 606, 608, such as a dielectric material In the example depicted in FIG. 10, the grooves 1002, 1004 are formed between the regions 606, 608, and thus the IC dies 114, 116, in an orientation perpendicular to the direction of the fluid flow 124. As the heat transfer between the regions 606, 608 is inhibited by the thermal choke 610, the amount of heat transferred from the second IC die 116 to the first IC die 114 is substantially limited, thereby substantially preventing the second IC die 116 from heating the first IC die 114.

Returning back to FIG. 1, some of the micro-bumps 118 or package bumps 132 may not be utilized to couple the circuitry of the interposer 112 and the circuitry of the package substrate 122. Such bumps 118, 132 may be referred to as dummy bumps. In any of the examples disclosed herein, one or more of the bumps 118, 132 disposed laterally between the dies 114, 116 may be configured as dummy bumps to facilitate vertical heat flow way from the second die 116 rather than horizontally to the first die 114 such that the first die 114 receives less heat from the second die 116. This technique may be utilized without conventional heat spreaders, with conventional heat spreaders or with the heat spreaders that provide lateral thermal isolation between dies, such as the heat spreaders described with reference to FIGS. 7-10 above.

To ensure the proper orientation of the IC dies 114, 116 relative to the fluid flow 124 within the electronic device 100, an indicia of orientation (hereinafter referred to an indicia 150) is disposed on the chip package. The indicia 150 is a indicator, such as words, letters, symbol or combination thereof, which clearly indicates how to orientate the chip package relative to the fluid flow 124 within the electronic device 100. The indicia 150 may be marked on any component of the chip package, such as the IC dies 114, 116, the overmold 138, interposer 112, package substrate 122, heat spreader, heat sink and the like. The indicia 150 may be disposed on one of the components of the chip package as a pin orientation mark, such as 1-pin, a polarity mark, a dot, a half moon indentation or mark, a triangle indentation or mark, a notch, or other visual indicator. For example, the chip package 110 illustrated in FIG. 1 includes an indicia 150 in the form of a symbol, such as an arrow, disposed on one of the IC dies 114, 116. In another example, the chip package 110 illustrated in FIG. 2 includes an indicia 150 disposed on the interposer 112. In another example, chip package 500 illustrated in FIG. 5 includes an indicia 150 disposed on the housing 502. In another example, the chip package 600 illustrated in FIG. 6 includes an indicia 150 disposed on one of the heat sinks 612, 614. In yet another example, chip package 600 illustrated in FIG. 6 includes an indicia 150 in the form of words (for example, HOT SIDE and COLD SIDE) disposed on the heat spreader 800. Thus, the indicia 150 disposed on the chip package designates an installation orientation of the interposer 112 which positions the first IC die 114 upstream of the second IC die 116 relative to the direction of cooling fluid flow 124 so that heat generated by the second IC die 116 does not substantially heat the first IC die 114.

The example depicted in FIG. 6 also illustrates that the chip package 600 may be disposed in packaging 650. The packaging 650 may be a polybag, blister pack, carton or other container suitable for shipping or storing the chip package 600 prior to installation onto the PCB 136. In addition to the chip package 600, the packaging 650 may also include product literature 652. The product literature 652 may include information relating to the chip package 600, such as performance specifications, data sheet, and/or installation instructions, wherein the product literature 652 may include an indicia 150 regarding how to orientate the chip package 600 upon installation to the PCB 136. For example, product literature 652 may include text that states that "the 1-pin should lead into the airflow" or similar instructions on how to orientate the IC dies 114, 116 relative to the directionality of the cooling fluid flow 124 to prevent the downstream second IC die 116 from heating the first IC die 114.

In operation, a method for cooling a first IC die of a chip package preferentially over a second IC die of a chip package is provided. The method includes inducing a flow of cooling fluid within a housing of an electronic device having IC dies coupled to an interposer. The flow has a direction defined by the cooling fluid flowing across a first IC die and a second IC die. The first IC die has a maximum safe operating temperature less than a maximum safe operating temperature of the second IC die. The method provides directionality of the cooling fluid flow sequentially across the IC dies, which substantially prevents the downstream second IC die from heating the upstream first IC die. This allows a die having greater temperature sensitivity to be utilized alongside a die that generates a greater amount of heat in a single chip package without having to rely on costly cooling countermeasures.

In another mode of operations, a method for constructing an electronic device is provided. The method includes placing an integrated circuit chip package such that a first predetermined die in the chip package is upstream of a second predetermined die in the chip package relative to the airflow direction of the electronic device, wherein the first IC die has a greater sensitivity to temperature than the second IC die. Thus, as discussed above, when the electronic device is in operation, the downstream second IC die is substantially prevented from heating the upstream first IC die.

The electronic device described above advantageously reducing the amount of heat transferred between IC in a chip package. By preventing heating of one die by the other, an IC die a lesser sensitivity to heat may be utilized proximate a die which has a higher sensitivity to heat or is a heat generator. Moreover, the die cooling techniques described above may be readily implemented at a minimal cost, thereby eliminating the need for costing temperature control measures.

While the foregoing is directed to examples of the present implementation, other and further implementations of the disclosure may be devised without departing from the basic scope thereof, and the scope thereof is determined by the claims that follow.

What is claimed is:

1. A chip package, comprising:
   a package substrate having a top surface, a bottom surface, and a plurality of solder balls on the bottom surface;
   a first IC die coupled to the top surface of the package substrate;
   a second IC die coupled to the top surface of the package substrate and having a maximum safe operating temperature greater than a maximum safe operating temperature of the first IC die; and
   an indicia disposed on the chip package, wherein the indicia designates an installation orientation of the package substrate to a circuit board by order of the maximum safe operating temperatures which positions the first IC die having a lower of the maximum safe operating temperatures upstream of the second IC die relative to a direction of cooling fluid flow.

2. The chip package of claim 1, wherein the indicia is disposed on the package substrate.

3. The chip package of claim 1, wherein the is disposed on one of the IC dies.

4. The chip package of claim 1 further comprising:
   an interposer coupled to the top surface of the package substrate by package bumps, the interposer having the indicia disposed thereon, the first IC die and the second IC die being coupled to the top surface of the package substrate through the interposer.

5. The chip package of claim 1, wherein the first IC die comprises:
   an optical device.

6. The chip package of claim 5, wherein the optical device is one or more of photo-detector, laser, or optical source.

7. The chip package of claim 1 further comprising:
   an interposer coupled to the top surface of the package substrate by package bumps, the first IC die and the second IC die being coupled to the top surface of the package substrate through the interposer, wherein at least one of the package bumps disposed between the IC dies are not coupled to circuitry of the interposer.

8. The chip package of claim 1 further comprising:
   a heat spreader disposed on the IC dies, the heat spreader having a thermal choke disposed between the IC dies.

9. The chip package of claim 8, wherein the thermal choke is filled with a dielectric material.

10. The chip package of claim 8, wherein the thermal choke is an air gap, one or more slots, one or more holes, or one or more grooves.

11. The chip package of claim 8, wherein the heat spreader has the indicia disposed thereon.

12. The chip package of claim 1 further comprising:
    a heat sink having the indicia disposed thereon.

13. The chip package of claim 1 further comprising:
    a vented housing coupled to an interposer and enclosing the IC dies, the housing having an inlet vent and outlet vent arranged to direct the fluid flow within the housing from the first IC die to the second IC die.

14. The chip package of claim 13, wherein the indicia is disposed on the vented housing.

15. An electronic device, comprising:
    a housing;
    a fan disposed in the housing, the fan operable to induce an fluid flow within the housing; and
    a chip package mounted to a circuit board disposed in the housing, the chip package comprising:
      an interposer or a package substrate having a top surface, a bottom surface, and a plurality of solder balls on the bottom surface;
      a first IC die mounted to the top surface of the interposer or the package substrate; and
      a second IC die mounted to the top surface of the interposer or the package substrate, the second IC die having a maximum safe operating temperature greater than a maximum safe operating temperature of the first IC die;
    wherein an orientation of the interposer or the package substrate within the housing positions the first IC die upstream of the second IC die relative to a direction of the cooling fluid flow.

16. The electronic device of claim 15 further comprising:
    a heat spreader disposed on the IC dies, the heat spreader having a first region disposed over the first IC die, a second region disposed over the second IC die, and a thermal choke disposed between the first and second regions; and
    heat sinks disposed on the first and second regions.

17. The electronic device of claim 15, wherein the chip package includes both the package substrate and the interposer, the package substrate including the top surface and the bottom surface, and wherein the package substrate is coupled to the interposer by package bumps, and wherein at least one of the package bumps disposed between the IC dies are not coupled to circuitry of the interposer.

18. A method for cooling an electronic device, comprising:
   inducing a flow of cooling fluid within a housing of the electronic device, the flow having a direction defined by the cooling fluid flowing across a first IC die and a second IC die, the IC dies coupled to an interposer or package substrate having a top surface, a bottom surface, and a plurality of solder balls on the bottom surface, the first IC die having a maximum safe operating temperature less than a maximum safe operating temperature of the second IC die.

19. The method of claim 18, wherein the housing is a vented housing, and wherein the inducing comprises:
   directing flow through the vented housing coupled to the interposer or the package substrate, the vented housing enclosing the IC dies.

20. The method of claim 18, wherein the inducing comprises:
   operating a fan disposed within the housing.

\* \* \* \* \*